(12) United States Patent
Kim et al.

(10) Patent No.: US 12,507,463 B2
(45) Date of Patent: Dec. 23, 2025

(54) AUTOMATED SEMICONDUCTOR WAFER SAMPLE PRE-PROCESSING SYSTEM

(71) Applicant: PAMTEK Co., Ltd., Hwaseong-si (KR)

(72) Inventors: Jae Woong Kim, Hwaseong-si (KR); Jung In Park, Hwaseong-si (KR); Jun Young Yeom, Suwon-si (KR); Jeong Heo, Hwaseong-si (KR); Je Hee Ryu, Seocheon-gun (KR)

(73) Assignee: PAMTEK Co., Ltd., Hwaseong-si (KR)

( * ) Notice: Subject to any disclaimer, the term of this patent is extended or adjusted under 35 U.S.C. 154(b) by 396 days.

(21) Appl. No.: 18/138,616

(22) Filed: Apr. 24, 2023

(65) Prior Publication Data

US 2024/0347385 A1    Oct. 17, 2024

(30) Foreign Application Priority Data

Apr. 13, 2023    (KR) ........................ 10-2023-0048673

(51) Int. Cl.
| | | |
|---|---|---|
| *H10D 84/01* | (2025.01) | |
| *H01L 21/304* | (2006.01) | |
| *H01L 21/68* | (2006.01) | |
| *H01L 21/683* | (2006.01) | |

(52) U.S. Cl.
CPC ......... *H10D 84/01* (2025.01); *H01L 21/3043* (2013.01); *H01L 21/68* (2013.01); *H01L 21/6836* (2013.01); *H01L 21/6838* (2013.01)

(58) Field of Classification Search
CPC ..... H10D 84/01; H01L 21/3034; H01L 21/68; H01L 21/6836; H01L 21/6838
USPC ............................................................ 73/863
See application file for complete search history.

(56) References Cited

U.S. PATENT DOCUMENTS

| | | | | |
|---|---|---|---|---|
| 7,896,047 | B2 * | 3/2011 | Yamamoto | H01L 21/67132 156/941 |
| 9,586,303 | B2 * | 3/2017 | Kato | B24B 21/06 |
| 9,953,407 | B2 * | 4/2018 | Ito | G01N 21/9501 |
| 2001/0021571 | A1 * | 9/2001 | Koma | H01L 21/67778 438/459 |
| 2003/0027494 | A1 * | 2/2003 | Yang | B28D 5/0094 451/6 |
| 2004/0168767 | A1 * | 9/2004 | Kanno | H01L 21/67248 156/345.52 |
| 2007/0232201 | A1 * | 10/2007 | Ito | B08B 3/02 451/41 |
| 2008/0031510 | A1 * | 2/2008 | Jung | H01L 21/67288 382/149 |
| 2009/0269861 | A1 * | 10/2009 | Kurosawa | H01L 22/20 156/345.24 |
| 2020/0185241 | A1 * | 6/2020 | Kunitake | H01L 22/12 |

(Continued)

FOREIGN PATENT DOCUMENTS

| | | | | |
|---|---|---|---|---|
| CN | 110858564 | A * | 3/2020 | ............. H01L 21/78 |
| JP | 2008293508 | A * | 12/2008 | |

(Continued)

*Primary Examiner* — Stephanie E Bloss
*Assistant Examiner* — Kevin C Butler
(74) *Attorney, Agent, or Firm* — Tucker Ellis LLP

(57) ABSTRACT

A semiconductor wafer sample pre-processing system improves productivity and process reliability by automating all process from cutting a into a plurality of wafer samples through polishing of the wafer samples.

3 Claims, 10 Drawing Sheets

(56) References Cited

U.S. PATENT DOCUMENTS

2024/0347385 A1* 10/2024 Kim .................... H01L 21/3043
2025/0100161 A1* 3/2025 Wang ................... G01B 11/306

FOREIGN PATENT DOCUMENTS

| | | | | | |
|---|---|---|---|---|---|
| JP | 4631293 | B2 | * | 2/2011 | |
| JP | 2019093474 | A | * | 6/2019 | |
| JP | 2024088430 | A | * | 7/2024 | |
| JP | 2024174330 | A | * | 12/2024 | .......... H01J 37/3174 |
| KR | 19980073771 | A | * | 11/1998 | |
| KR | 20080007219 | A | * | 1/2008 | ....... H01L 21/67745 |
| KR | 20080012185 | A | * | 2/2008 | ....... H01L 21/67132 |
| KR | 20090070195 | A | * | 7/2009 | ....... H01L 21/68707 |
| KR | 20100127713 | A | * | 12/2010 | ....... H01L 21/67132 |
| KR | 101845938 | B1 | | 4/2018 | |
| KR | 102095532 | B1 | * | 3/2020 | ......... H01L 21/6836 |
| KR | 20210141805 | A | * | 11/2021 | ....... H01L 21/68785 |
| KR | 20220162946 | A | * | 12/2022 | ....... H01L 21/67271 |
| KR | 102503634 | B1 | * | 2/2023 | ....... H01L 21/67742 |
| KR | 102628311 | B1 | * | 1/2024 | ....... H01L 21/67271 |

\* cited by examiner

AUTOMATED SEMICONDUCTOR WAFER SAMPLE PRE-PROCESSING SYSTEM

RELATED APPLICATION DATA

This application claims the benefits of South Korean Application No. 10-2023-0048673, filed on Apr. 13, 2023, the disclosure of which is incorporated herein by reference in its entirety.

BACKGROUND OF INVENTION

1. Technical Field

The present disclosure relates to an automated semiconductor wafer sample pre-processing system, more specifically, it relates to an automated semiconductor wafer sample pre-processing system, which improves productivity and improves process reliability by automating all processes starting with cutting into a plurality of semiconductor wafer samples through polishing. It relates to a sample pre-processing system.

2. Description of the Related Art

A scanning electron microscope (SEM) is an equipment for analyzing defects in semiconductor devices. To analyze a wafer sample using SEM, it is necessary to prepare a sample first. Since precision and speed are especially required in the manufacture of semiconductor wafer samples, it is essential to automate all processes from cutting multiple wafer samples through polishing. In this case, there remains a task to improve the process reliability of wafer sample manufacturing while improving productivity through automation of the entire process.

SUMMARY OF THE INVENTION

To solve the above problems, the present disclosure provides a semiconductor wafer sample pre-processing system that improves productivity by automating a wafer sample manufacturing process and at the same time improves the reliability of the sample manufacturing process.

In order to solve the above problems, a semiconductor wafer sample pre-processing system according to an embodiment of the present disclosure at least includes a ring frame loading unit for loading a ring frame and a wafer mounted thereon, which are integrally configured with each other by being attached to a tape; a wafer cutting unit for cutting the wafer loaded in the ring frame loading unit into a plurality of wafer samples, each wafer sample transferred by means of a transfer rail; a wafer sample alignment unit for aligning the position of the wafer sample while transferring the cut wafer samples to a grinding unit via an expanding unit; a grinding unit for grinding the wafer samples; and at least a polishing unit for polishing the wafer samples that have passed through the grinding unit, wherein the ring frame loading unit includes a frame rack configured to seat a plurality of ring frames, wherein the frame rack is configured so that a cutting position of each of the plurality of wafers can be designated.

In the semiconductor wafer sample preprocessing system according to an embodiment of the present disclosure, the wafer cutting unit includes a ring frame plate for holding the ring frame loaded from the ring frame loading unit and a wafer seated therein to perform a cutting process, and a groove serving as a drainage channel along the periphery of the ring frame plate.

In the semiconductor wafer sample preprocessing system according to an embodiment of the present disclosure, the ring frame plate includes a plurality of level adjustment bolts arranged to support the outer edge of the wafer.

In the semiconductor wafer sample preprocessing system according to an embodiment of the present disclosure, the wafer sample alignment unit includes an adsorption unit including an adsorption pad for adsorbing the cut wafer sample, and at least one surface of the adsorption pad is a suction pad. Protrusions are included to enlarge the surface.

In the semiconductor wafer sample pre-processing system according to an embodiment of the present disclosure, water lines supplying water to each of the grinding unit and the polishing unit are configured independently, so that when the water line of the grinding unit is in operation, the polishing unit configured to stop the operation of the water line.

According to the semiconductor wafer sample preprocessing system of the present disclosure, work productivity can be further improved with automation.

According to the semiconductor wafer sample pretreatment system of the present disclosure, the problem of scattering of foreign substances, such as water, into the equipment during the process can be prevented, and thus the reliability and durability of the equipment can be improved.

According to the semiconductor wafer sample preprocessing system of the present disclosure, it is possible to prevent wafer samples from being lost due to alignment errors during the sample manufacturing process, thereby improving work reliability.

According to the semiconductor wafer sample preprocessing system of the present disclosure, the accuracy of the dicing process can be improved.

According to the semiconductor wafer sample preprocessing system of the present disclosure, the sample can be more accurately aligned and whether the sample is aligned can be more easily confirmed.

On the other hand, the effects of the present disclosure are not limited to the effects mentioned above, and various effects may be included within a range apparent to those skilled in the art from the contents to be described below.

DESCRIPTION OF THE PREFERRED EMBODIMENTS

Figure 1:
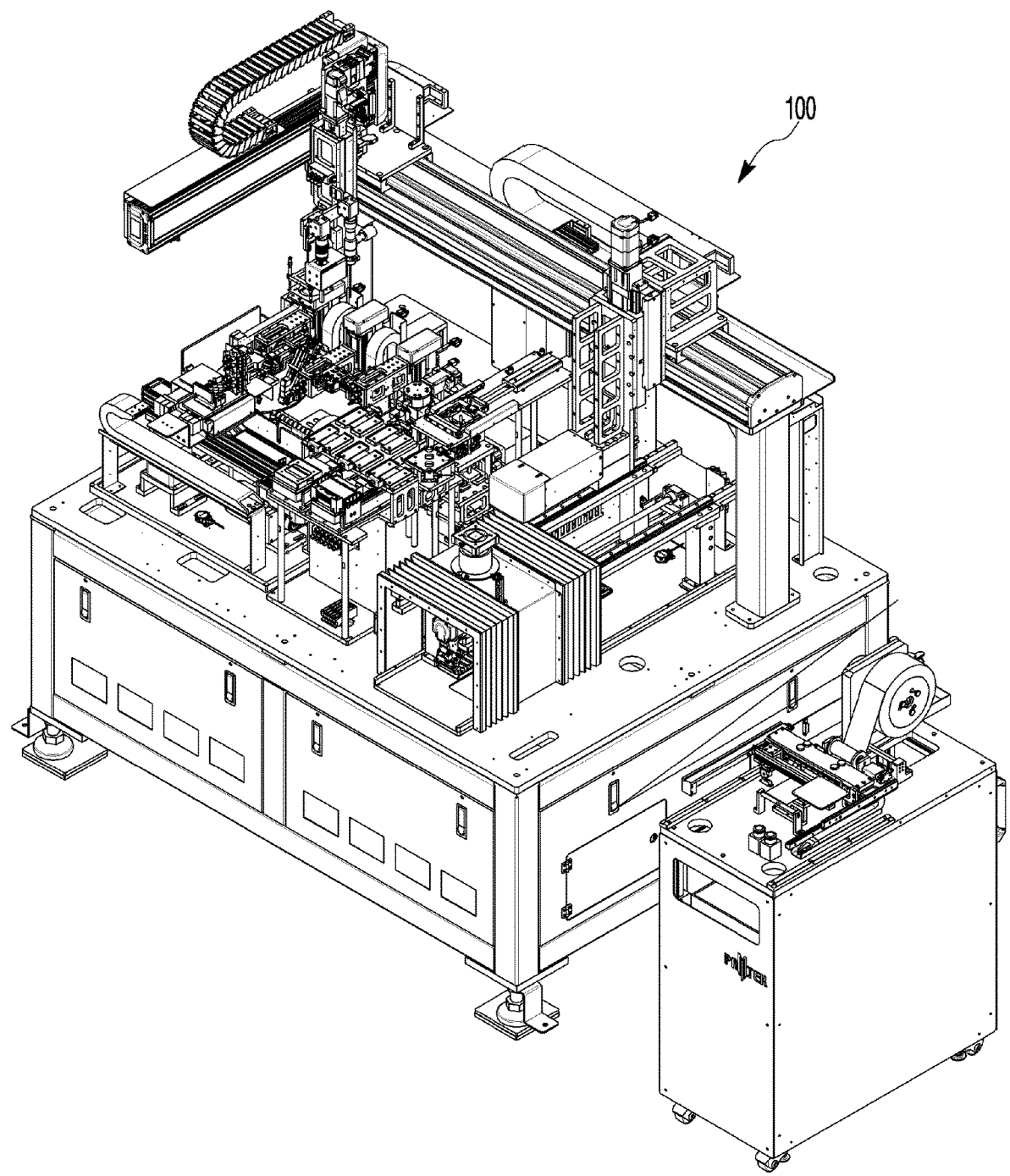
FIG. 1 is a schematic perspective diagram of a semiconductor wafer sample pre-processing system according to the present disclosure.

To fully understand the present disclosure, the advantages in operation of the present disclosure, and the objects achieved by the practice of the present disclosure, reference should be made to the accompanying drawings illustrating preferred embodiments of the present disclosure and the contents described in the accompanying drawings.

Hereinafter, the present disclosure will be described in detail by describing preferred embodiments of the present disclosure with reference to the accompanying drawings. Same reference numerals in each figure indicate same features.

An object of the present disclosure is to provide a semiconductor wafer sample pre-processing system that improves productivity by automating a wafer sample manufacturing process and at the same time improves sample manufacturing process reliability.

Figure 2:
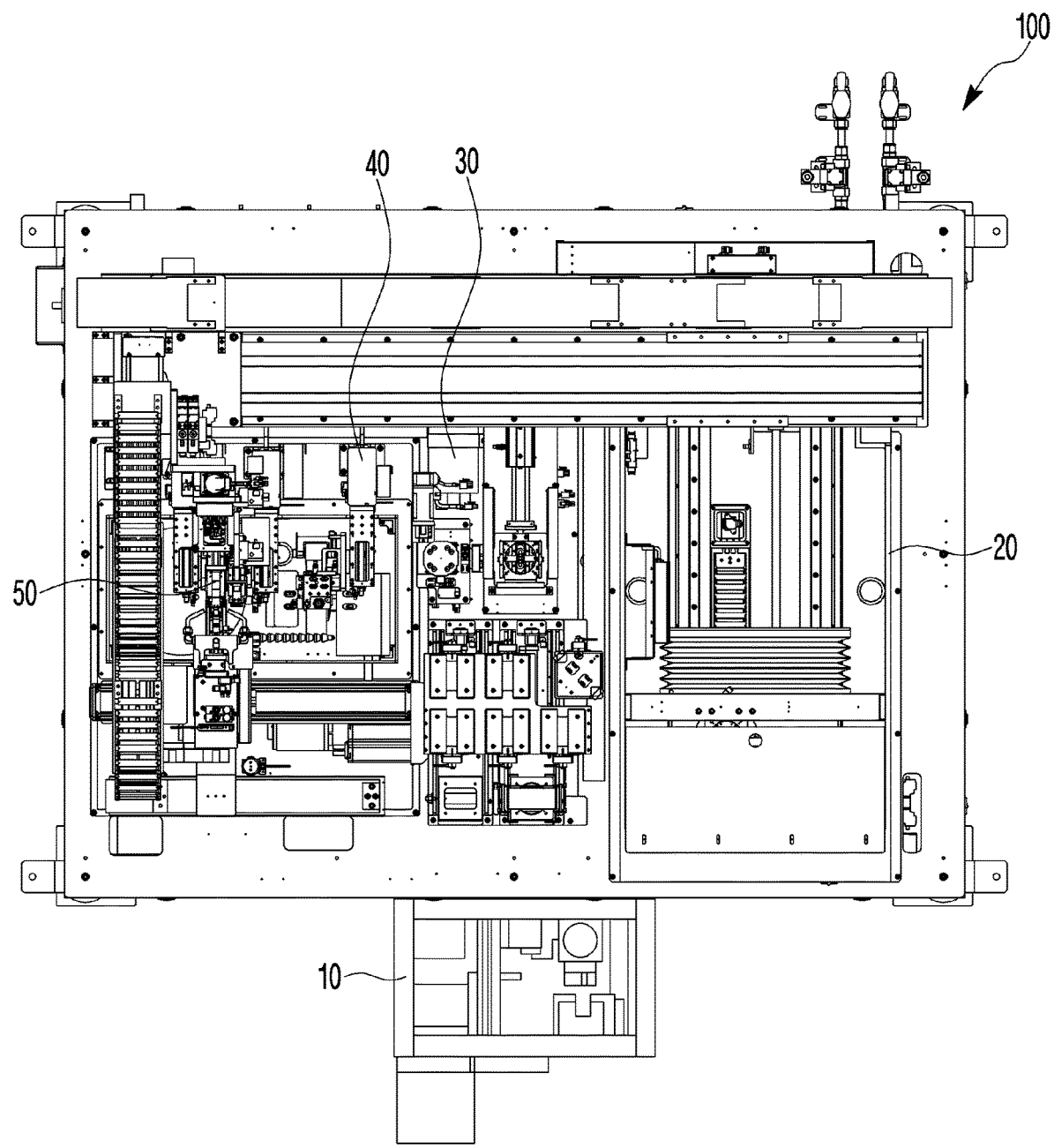
FIG. 2 is a schematic top diagram of the semiconductor wafer sample pre-processing system of FIG. 1.

FIG. 1 is a schematic perspective diagram of a semiconductor wafer sample pre-processing system according to the present disclosure, and FIG. 2 is a schematic top diagram of the semiconductor wafer sample pre-processing system of FIG. 1.

FIGS. 1 and 2, the semiconductor wafer sample pre-processing system 100 according to the present disclosure is configured to include at least a ring frame loading unit 10, a wafer cutting unit 20, a wafer sample alignment unit 30, a grinding unit 40, and a polishing unit 50.

In addition to the above-listed units, the semiconductor wafer sample pre-processing system may include additional units, for example, a series of units for carrying out sample processing steps including a tape mounter unit that integrally forms a ring frame and a wafer using a tape, a ring frame loading unit, a transfer rail unit for transporting wafers from the ring frame loading unit at least to a wafer cutting unit, a wafer cutting unit, an expander unit for picking up wafer samples by expanding the width of the cutting line formed in the wafer cutting unit, an alignment unit for controlling position alignment of wafer samples, a grinding unit, a polishing unit, and/or an unloading unit for discharging polished wafer samples. The units for carrying our sample processing steps operate automatically within the system of the present disclosure.

Hereinafter, for convenience of description, a detailed description will be made focusing on units different from conventional units among a plurality of units constituting the semiconductor wafer sample pre-processing system. Among the units of the existing known semiconductor wafer sample pre-processing systems, specific descriptions of units that can be designed and changed by those skilled in the art and features within the units are already known to those skilled in the art, so detailed descriptions thereof will be omitted.

The ring frame loading unit 10 is a unit for loading a ring frame and a wafer mounted thereon, which are integrally formed with each other by being attached with a tape.

Figure 3A:
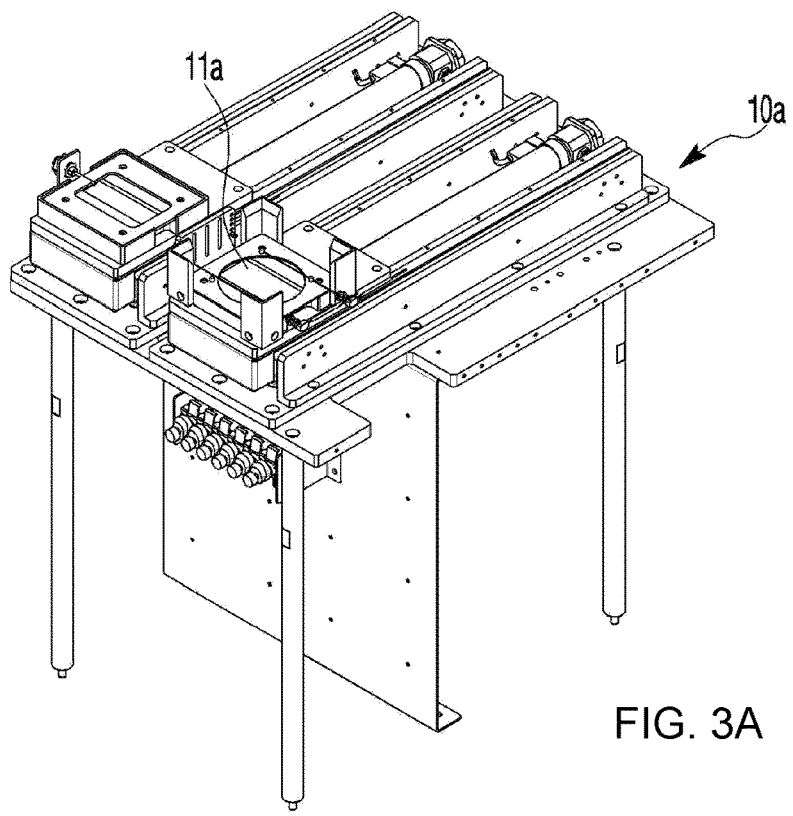
FIG. 3A is a schematic diagram of a conventional ring frame loading unit and FIG. 3B is a schematic view of a ring frame loading unit according to the present disclosure.

Referring to FIG. 3A, the conventional ring frame loading unit 10$a$ has a structure designed to load the ring frame 11$a$ once per sample.

Figure 3B:
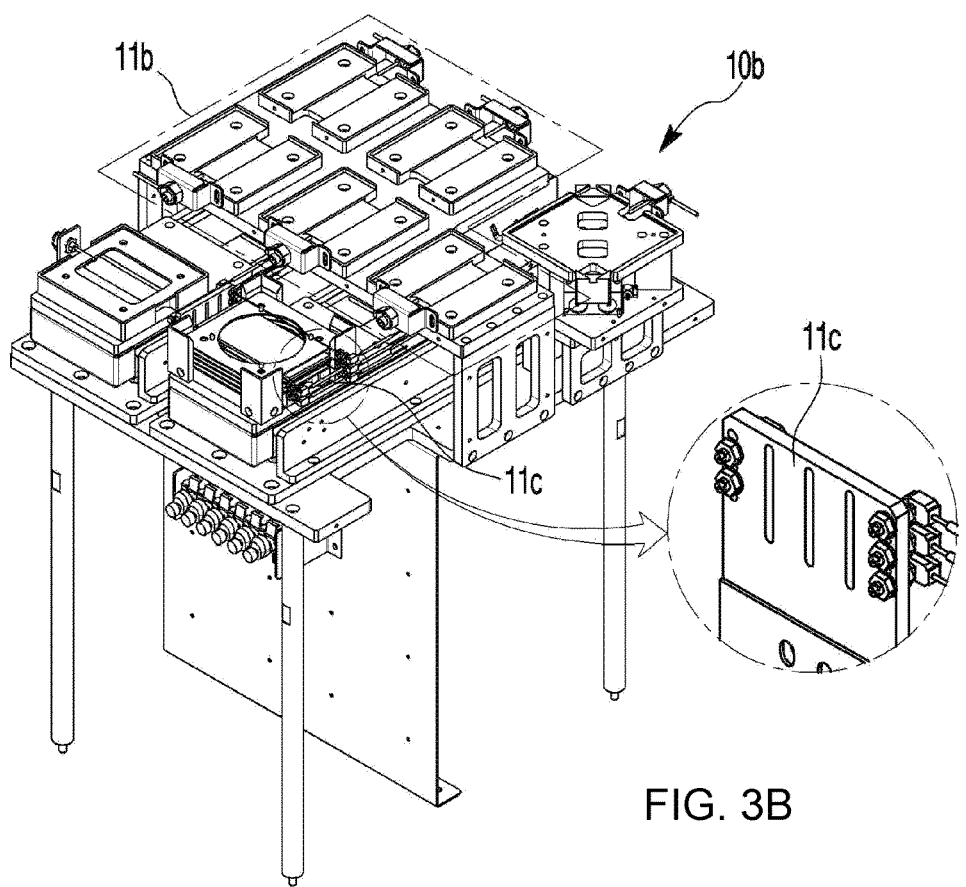

Referring to FIG. 3B, since the ring frame loading unit 10$b$ according to an embodiment of the present disclosure is configured to load a plurality of ring frames, the ring frame loading unit is designed to include a frame rack 11$b$ configured to store a plurality of ring frames. Without a frame rack, the next frame can be input and work can be performed only after the progress of one frame inserted for ring frame loading has been completed. However, as shown in FIG. 3B, when the ring frame loading unit sequentially proceeds after storing several frames, the process can be continuously operated even if the operator is not in front of the equipment. This can improve work productivity. In addition, the ring frame loading unit 10$b$ of FIG. 3B includes a sensing unit 11$c$ including a plurality of sensor devices in the loading unit for loading wafers, which measures the number of wafers loaded in the actual loading unit but is not limited in the sensing method, and may be, for example, an optical sensor including a light receiving unit and a light generating unit.

The wafer is loaded in the ring frame and then is transferred by means of the transfer rail. The transferred wafer is cutting into a plurality of wafer samples in the wafer cutting unit 20. The wafer cutting unit is a unit that obtains a sample by cutting the wafer loaded in the ring frame loading unit into a predetermined shape.

Figure 4A:
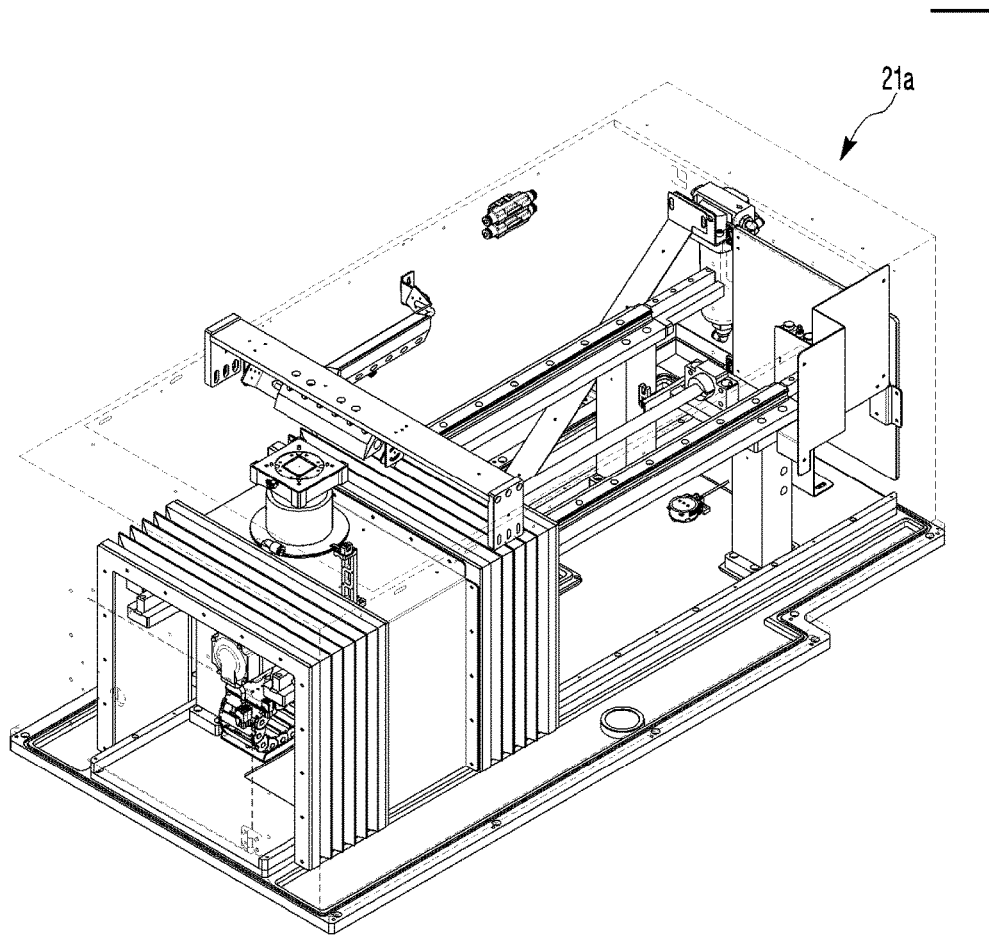
FIG. 4A is a schematic diagram of the cutting unit of the conventional wafer cutting unit.
Figure 4A:
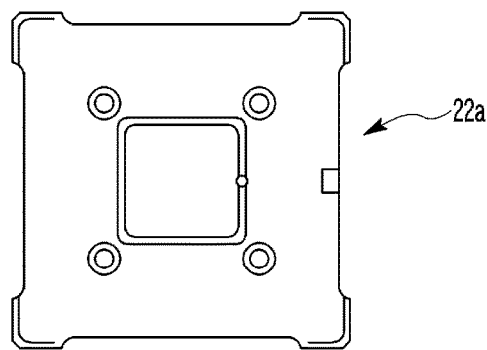
Figure 4B:
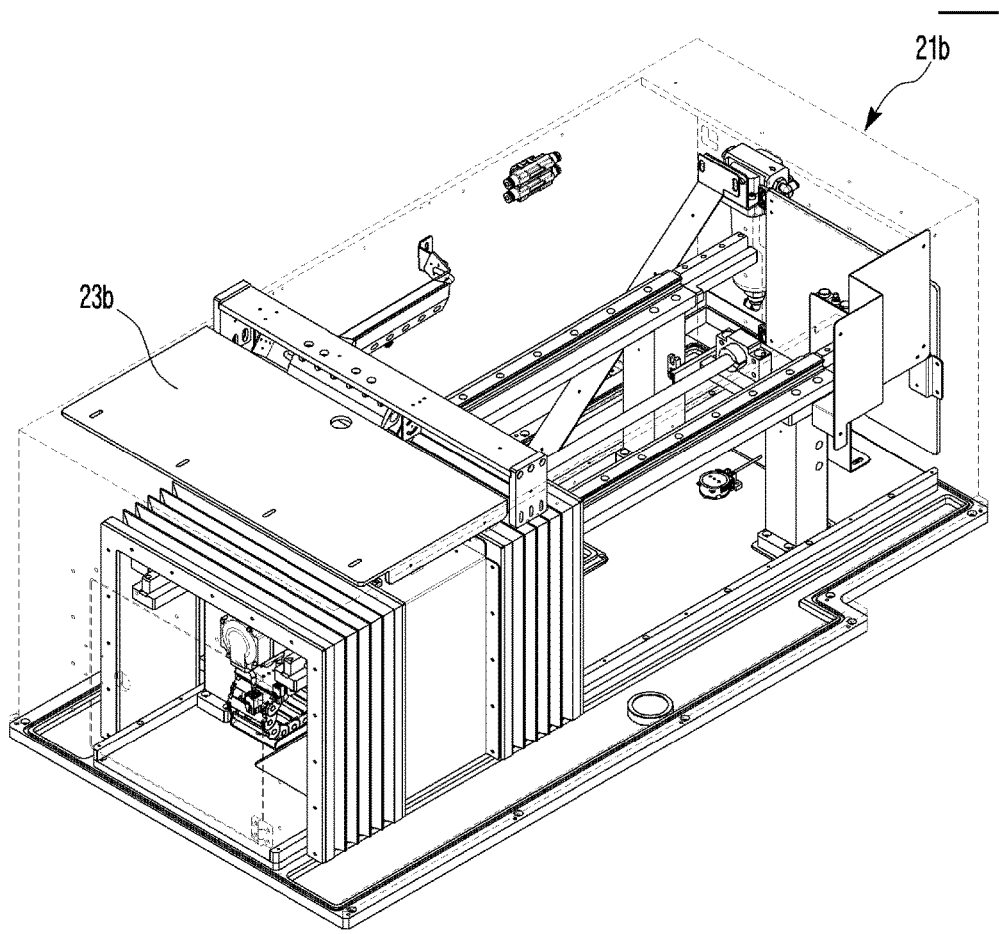
FIG. 4B is a schematic view of the cutting unit according to the present disclosure.
Figure 4B:
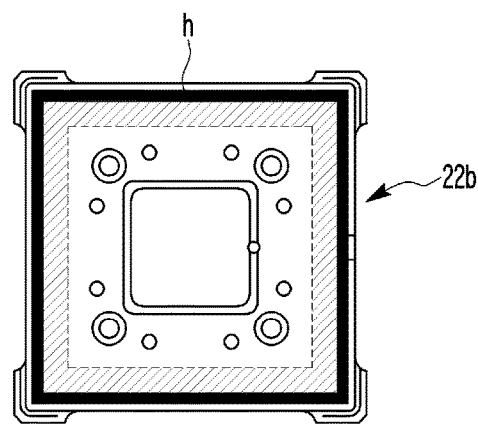

FIG. 4A is a schematic diagram of the cutting portion 21$a$ and the ring frame plate 22$a$ of the conventional wafer cutting unit 20$a$, FIG. 4B is a schematic diagram of the cutting portion 21$b$ and the ring frame plate 22$b$ of the wafer cutting unit 20$b$ of the present disclosure. The ring frame plate is a plate for mounting the ring frame and is disposed below the wafer cutting unit.

In general, when cutting a wafer, distilled water (DI-water) is sprayed to the cutting portion, and at this time, the water introduced from the circumference of the ring frame plate on which the ring frame is mounted remains in the air line of the plate, and this water has a problem of being scattered into the equipment through the vacuum hole during multiple blow operations. The present inventors added a groove functioning as a drainage channel capable of draining water to the outer surface of the conventional ring frame plate to improve the problem of water scattering into the equipment. Due to this groove, a problem that water remains in the air line can be prevented.

More specifically, the hatched portion of the ring frame plate in FIG. 4B is configured to have a slope in which the thickness becomes thinner as it goes toward the outer direction, so that the water introduced during the cutting process can easily flow toward the outer edge. As a result, it has a structure in which a drainage channel is substantially formed along the periphery of the ring frame plate. In addition, due to the inclined structure of the ring frame plate, the ring frame plate and the periphery of the ring frame may not be in complete contact, so it is possible to prevent water between components from scattering around the equipment in the process of detaching the ring frame from the plate.

FIG. 4B illustrates that the groove "h" surrounds the entire periphery of the plate with a closed curve, but it is also possible to form the groove only on a part of the periphery for the function of preventing water from scattering into the equipment. It is also possible to configure so that the groove is not formed to be one entire groove instead a plurality of grooves is disposed along the circumference.

Figure 4C:
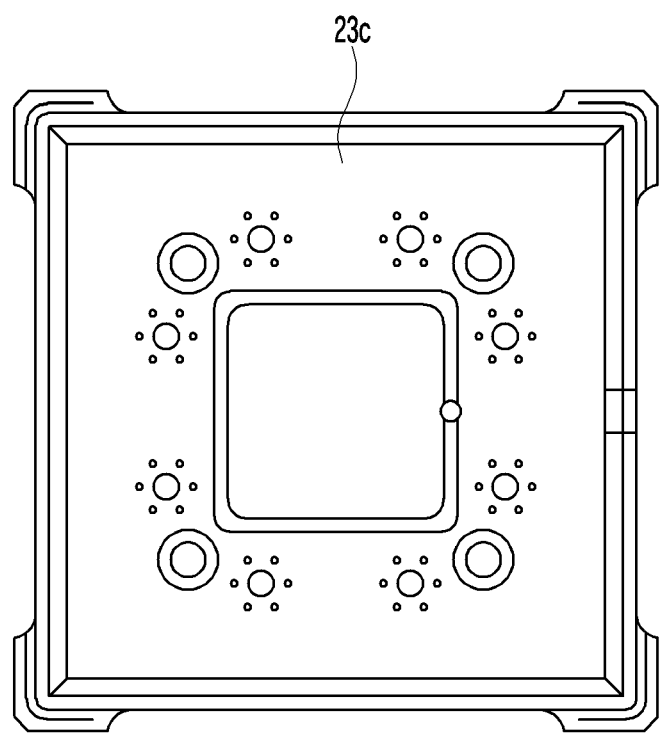
FIG. 4C is a schematic diagram of the plate having a plurality of level adjustment bolts.

FIG. 4C shows a plate 23 in which a plurality of level adjustment bolts 23$c$ are additionally disposed along the outer edge of the sample in the ring frame plate of FIG. 4B. In general, some uncut portions occur during cutting. If the process continues with a wafer with less cutting progress, the wafer sample is lost when transferring the wafer sample from the wafer alignment unit to the grinding unit, as will be described later.

To prevent this, by inserting a level adjustment bolt into the plate, the flatness of the wafer is improved during the cutting process, so that portions where the cutting progresses intermittently can be prevented. FIG. 4C illustrates that the level adjustment bolts are arranged around the ring frame, but the position or number of level adjustment bolts can be appropriately designed and changed by those skilled in the art as needed.

Again, referring to FIG. 4C, the cutting part 21b of the wafer cutting unit, unlike the conventional cutting part 21a, further includes an additional plate-shaped cover 23b at the top so that it can prevent the sprayed water from scattering into the equipment. The plate-shaped cover is preferably made of a waterproof material and/or designed to be easily detachable from the wafer cutting unit according to equipment conditions.

On the other hand, the semiconductor wafer sample pre-processing system of the present disclosure includes a camera unit to optically detect the alignment of the wafer sample cut in the wafer cutting unit. An image obtained through such a camera unit is input to a dicing vision so that a worker can discern the status of a cutting position.

Figure 5A:
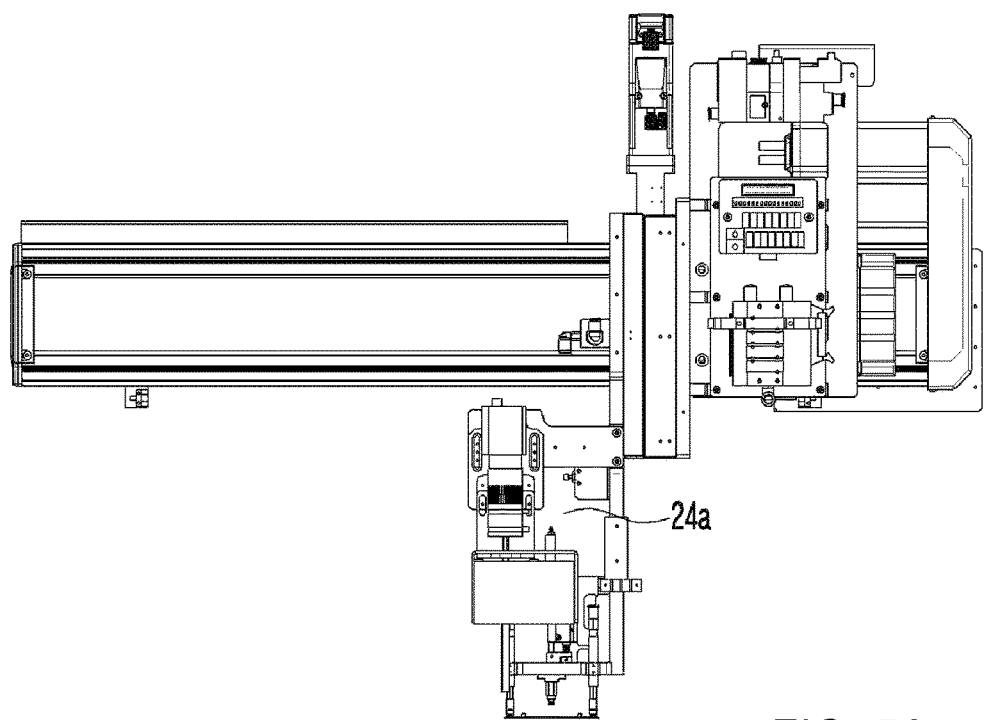
FIG. 5A is a schematic diagram of the camera unit of the conventional wafer cutting unit.
Figure 5B:
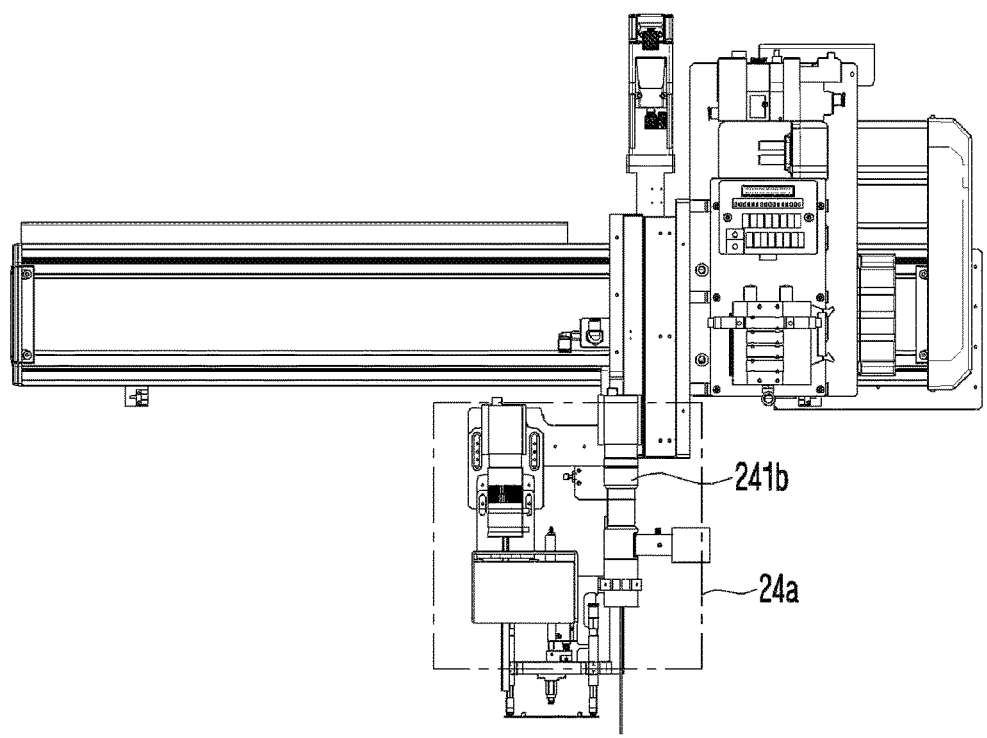
FIG. 5B is a schematic view of the cutting unit according to the present disclosure.

FIG. 5A is a schematic diagram of the conventional camera unit 24a and FIG. 5B is a schematic diagram of the camera unit 24b of the present disclosure. Since it is important to cut a desired position of the wafer during the wafer cutting process, there is a demand for obtaining high-resolution and high-magnification images from the camera unit.

This may be possible by replacing the camera mounted on the camera unit with a high-performance camera with improved resolution and magnification. However, when replacing the camera with another camera, it is accompanied by the hassle of developing a new image program linked with the existing camera to enlarge the cutting position along with the overall image of the wafer sample. When the camera unit 24b of the present disclosure is introduced, it is possible to additionally secure a high-resolution image of the cutting position of the sample without developing a new image program, so that the cutting position can be clearly identified. The camera unit 24b of the present disclosure is designed to further include at least one high-magnification camera 241b in addition to the camera installed in the existing camera unit.

On the other hand, another one of the causes that interfere with wafer alignment is misalignment due to a brightness error of a buffer. To improve this, the present inventors introduced a design in which a back light is added to the lower part of the buffer to improve the illumination of the buffer. The backlight allows the alignment of wafer samples to be clearly distinguished without the risk of buffer brightness errors.

Next, the cut wafer will be transferred to a grinding unit (to be described later) via an expanding unit. Since process defects, such as loss of wafer samples, occur when the wafer samples are not aligned in the correct position during the transfer process, the wafer sample alignment unit 30 is examined. In the present disclosure, the wafer sample alignment unit collectively refers to a plurality of units configured to align wafer samples cut from the cutting unit to the grinding unit in the present system. It is to be noted that the design changes made by the present inventors in the alignment unit of the present disclosure to improve the alignment reliability can be applied in various ways in the equipment system.

Figure 6A:
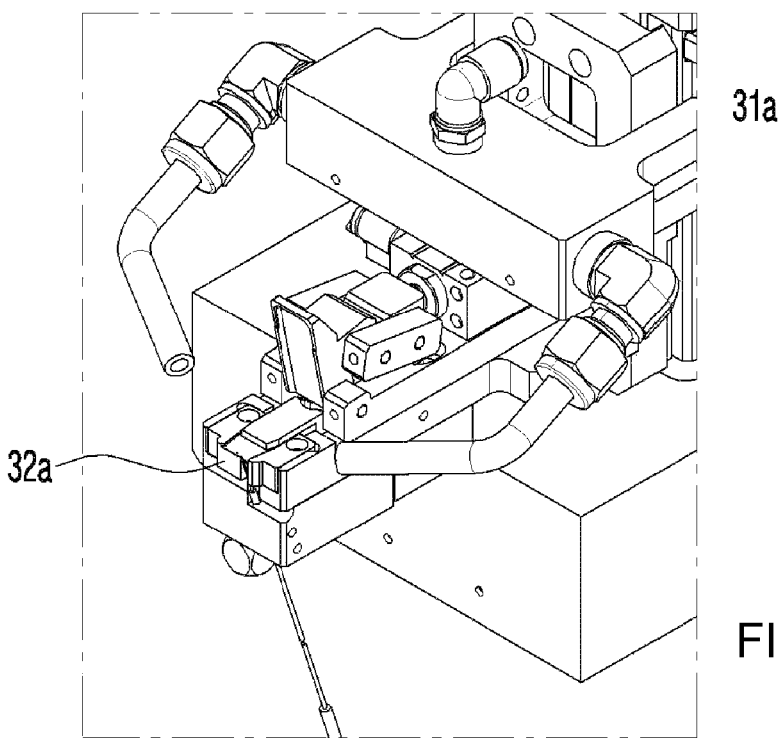
FIG. 6A is a schematic diagram of a suction unit for suctioning a wafer sample in the wafer sample alignment unit.
Figure 6B:
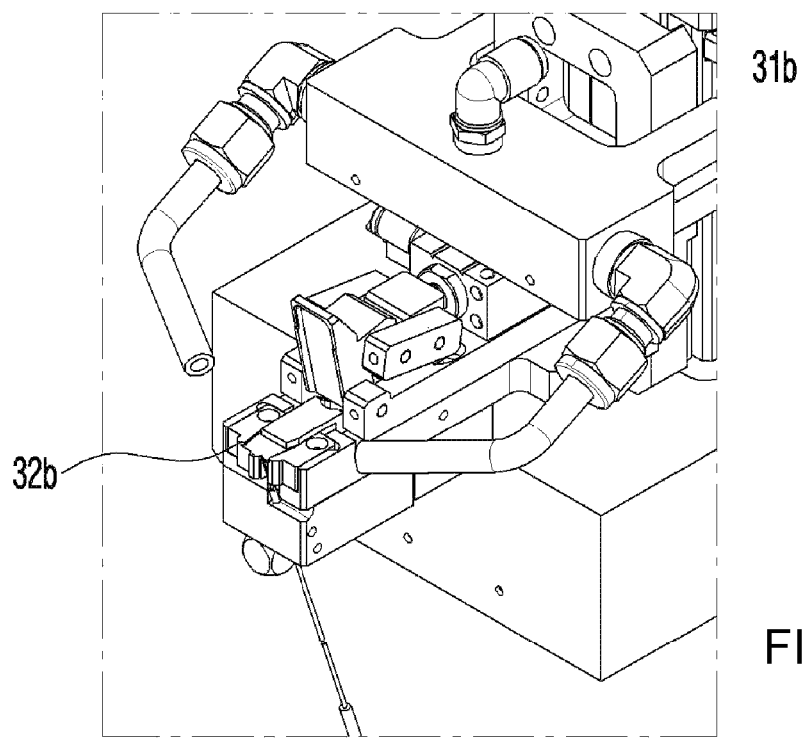
FIG. 6B is a schematic view of a suction unit of the wafer sample alignment unit according to the present disclosure.

FIG. 6A is a schematic diagram of a suction unit 31a suctioning a wafer sample in the wafer sample alignment unit, and FIG. 6B shows a suction unit 31b of the wafer sample alignment unit according to the present disclosure.

In general, when a vacuum process for suctioning a wafer sample is performed in a wafer alignment unit, it is frequently not possible to generate sufficient vacuum pressure with the wafer sample because the space where the vacuum is generated and the portion where the wafer sample comes into contact are too narrow. In the case of the wafer vacuum suction pad 32a of the conventional wafer alignment unit, the outside of the exposed portion is configured to be flat, and a sufficient wafer vacuum space is not secured, so there is a concern that loss may occur during the wafer pick-up process.

On the other hand, the wafer suction pad 32b of the wafer alignment unit of the present disclosure additionally includes a protrusion from the conventional suction pad and allows the vacuum generation position to be configured on the protrusion, so that the wafer sample is more stably attached by the suction pad. Although not specifically shown, the suction pad of the present disclosure is designed to improve abrasion compared to conventional suction pads through material change and surface post-treatment, or to further include a safety net (not shown) installed below the wafer alignment unit so that a lost wafer is not moved to another space of the equipment when additionally picking up the wafer. If the safety net is installed, the lost wafer samples can be gathered in the safety net after repeated pick-up processes and processed at once, increasing work convenience.

Next, the grinding unit 40 of the present disclosure will be described with reference to FIGS. 7A and 7B. The grinding unit is a unit that grinds the edge surface of the sample before polishing the wafer sample, and includes a wheel made of an abrasive material, for example, a diamond wheel, a shaft for rotating the wheel, and a housing supporting the shaft. The inventors of the present disclosure have attempted to solve the problem that some amount of load is continuously generated on the wheel by repeating the grinding process and as a result, the shaft fixed to the housing is loosened.

Figure 7A:
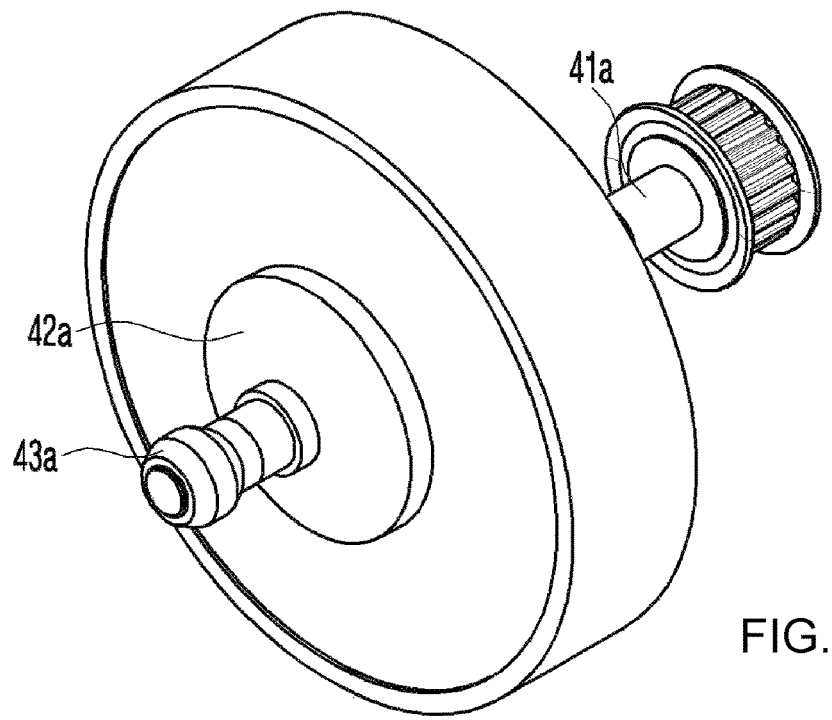
FIG. 7A is the structure of a conventional grinding unit.

Referring to FIG. 7A, the structure of a shaft 41a penetrating the center of a wheel of a conventional grinding unit, a housing 42a fixing the shaft, and a cap 43a attached to the end of the housing allows for the shaft fixed to the housing to easily loosen due to the load. In addition, since the wheel, the shaft, and the housing are designed to be separated from each other, even when the shaft rotates, it is a frequent problem that the wheel does not rotate effectively.

Figure 7B:
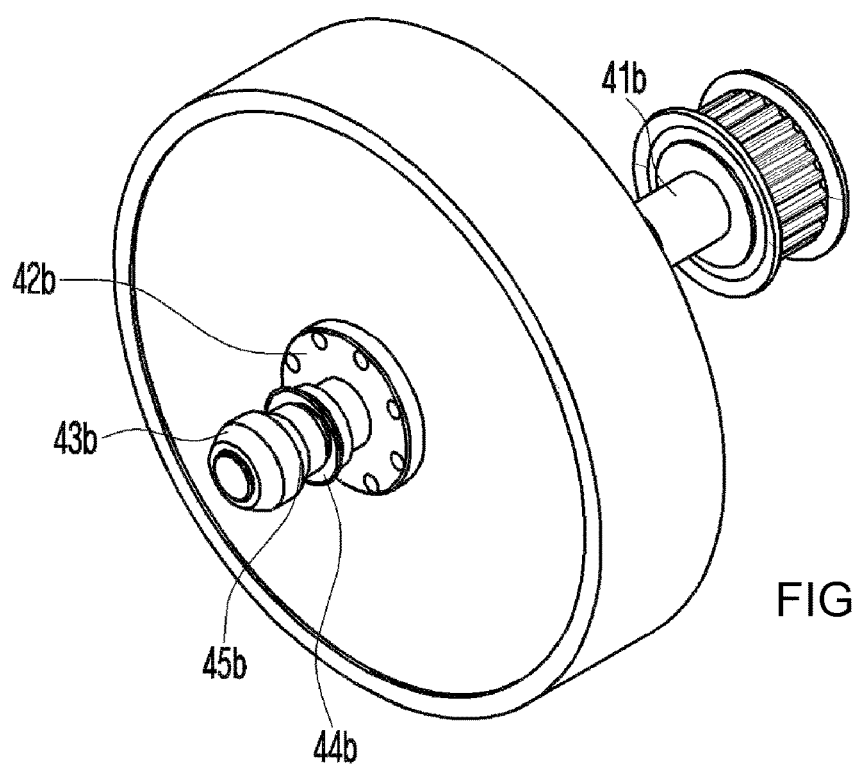
FIG. 7B shows the structure of the grinding unit of the present disclosure.

In the structure of the grinding unit of the present disclosure shown in FIG. 7B, in addition to the cap 43b attached to the end of the housing around the housing 42b fixing the shaft 41b, the tapered part 44b and the clip part 45b is further included. The tapered part and the clip part have a central hole passing through the shaft. Due to the improvement of the coupling structure, a problem caused by the shaft being released from the housing during operation can be solved. Furthermore, since the housing and the wheel are fixed with a fastening means, for example, a screw, occurrence of a problem in which the wheel comes off the shaft can be effectively prevented. More preferably, the material of the cap 43b may be changed from MC nylon, which is the material of the conventional cap 43a, to stainless steel, but is not limited thereto.

The polishing unit 50 for polishing a wafer that has undergone the above-described grinding unit process will be described. The polishing unit is a component for increasing reflectivity of the sample, maintaining flatness, or removing scratches.

Figure 8A:
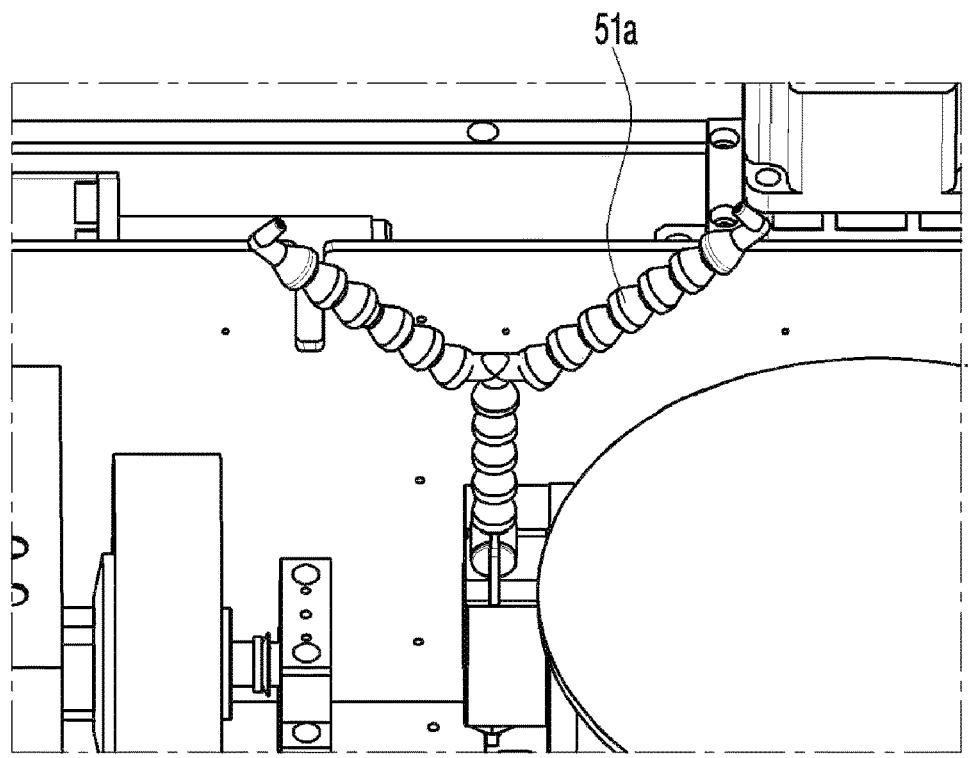
FIG. 8A is a structure related to a water line of a conventional polishing unit.
Figure 8B:
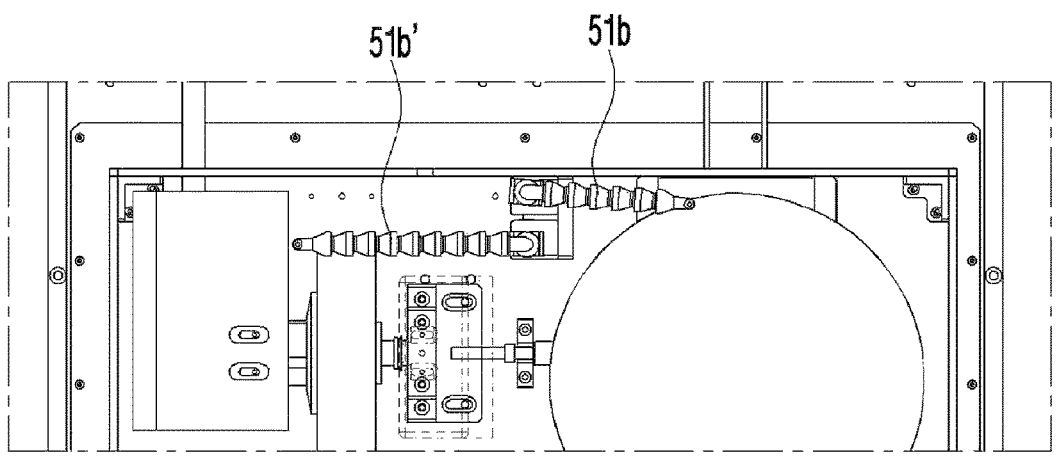
FIG. 8B shows a structure related to a water line of a polishing unit according to the present disclosure.

In general, in the case of water lines connected to the polishing unit, each water line for the grinding unit and the polishing unit is designed to diverge from a common water line 51a, as shown in FIG. 8B. In this case, even when only the polishing unit is operated, the inconvenience that water is always used toward the grinding unit occurs.

On the other hand, in the polishing unit 50b of the present disclosure of FIG. 8 B, the water line 51b supplied to the grinding unit and the water line 51b' supplied to the polishing unit are designed to be separately driven from each other, so that the water line supplied to the grinding unit may be blocked when the polishing unit is operated.

According to the above-described semiconductor wafer sample pre-processing system of the present disclosure, work productivity is further improved along with automation, and the problem of scattering foreign substances such as water into the equipment during the process is prevented, thereby improving equipment reliability and durability, and the wafer sample can be prevented from being lost due to misalignment during the sample manufacturing process, thereby improving operation reliability, and the accuracy of the dicing process is improved, and the sample is to be more accurately aligned and it is more easily confirmed whether the sample is aligned.

In the above, the technical idea of the present disclosure has been described with the accompanying drawings, but this is an exemplary description of the preferred embodiment of the present disclosure, but does not limit the present disclosure. In addition, it is obvious that various modifications and imitations can be made by anyone skilled in the art to which the present disclosure belongs without departing from the scope of the technical concept of the present disclosure.

What is claimed is:

1. A semiconductor wafer sample pre-processing system at least comprising:
    a ring frame loading unit for loading a ring frame and a wafer mounted thereon which are attached to each other with a tape so as to be integrally formed with each other;
    a wafer cutting unit for cutting the wafer loaded in the ring frame loading unit into a plurality of wafer samples;
    a wafer sample alignment unit for aligning a position of the wafer samples while each wafer sample is transferred to a grinding unit via an expanding unit;
    a grinding unit for grinding the wafer samples; and
    a polishing unit for polishing the wafer samples that have passed through the grinding unit, and
    wherein the ring frame loading unit includes a frame rack configured to mount a plurality of ring frames, and the frame rack is configured to designate a cutting position of each of the plurality of wafers introduced into the frame rack,
    wherein the wafer cutting unit includes a ring frame plate for holding the ring frame and the wafer mounted thereon, which are loaded from the ring frame loading unit to perform a cutting process, and the ring frame plate comprises a groove functioning as a drainage channel along the periphery of the ring frame plate,
    wherein the ring frame plate includes a plurality of level adjustment bolts arranged to support an outer edge of the wafer,
    wherein the ring frame plate is configured to have a slope in which the thickness becomes thinner as it goes toward the outer direction,
    wherein the wafer sample alignment unit includes at least two cameras, which function linked with one existing image program,
    wherein a buffer which holds the wafer in the wafer sample alignment unit comprises a backlight on a lower part of the buffer, and
    wherein the grinding unit comprises a shaft and a housing fixing the shaft, and a cap, a tapered part, and a clip part are further provided with an end of the housing, and the tapered part and the clip part have a central hole passing through the shaft.

2. The system according to claim 1, wherein the wafer sample alignment unit comprises a suction unit including a suction pad for suctioning the cut wafer sample, and at least one surface of the suction pad comprises a protrusion for extending a surface of the suction pad.

3. The system according to claim 1, wherein water lines supplying water to each of the grinding unit and the polishing unit are configured to be independent, so that operation of the water line of the polishing unit is stopped when the water line of the grinding unit operating.

* * * * *